United States Patent [19]

Min et al.

[11] Patent Number: 5,144,585
[45] Date of Patent: Sep. 1, 1992

[54] SUPPLY VOLTAGE CONVERTER FOR HIGH-DENSITY SEMICONDUCTOR MEMORY DEVICE

[75] Inventors: Dong-Sun Min; Chang-Hyun Kim; Dae-Je Jin, all of Seoul, Rep. of Korea

[73] Assignee: Samsung Electronics Co., Ltd., Suweon, Rep. of Korea

[21] Appl. No.: 359,127

[22] Filed: May 31, 1989

[30] Foreign Application Priority Data

May 1, 1989 [KR] Rep. of Korea .................. 1989-5792

[51] Int. Cl.[5] .............................................. G11C 13/00
[52] U.S. Cl. ...................................... 365/226; 365/227
[58] Field of Search ............... 365/174, 226, 227, 229; 307/18

[56] References Cited

U.S. PATENT DOCUMENTS 5,077,518 12/1991 Han ..................... 365/226

Primary Examiner—Terrell W. Fears
Attorney, Agent, or Firm—Robert E. Bushnell

[57] ABSTRACT

A supply voltage converter circuit for use in reduced geometry high-density semiconductor memory devices, capable of reducing current consumption to as small a value as possible and achieving high-speed operation. The circuit includes a reference voltage generator, for generating a constant reference voltage, and a peripheral power-supply circuit, and array power-supply circuit for providing the internal supply voltage to the peripheral and array circuits, respectively. Each of the peripheral and array power circuits includes a divider, generating a voltage proportional to said internal supply voltage; a main power-supplying part including a main differential amplifier which compares the proportional voltage with said reference voltage and is activated by a given pulse, and a main power component providing the internal source supply voltage in response to output signal of the main differential amplifier; and a sub power supply part including a sub differential amplifier comparing the proportional voltage with the reference voltage, the differential amplifier being at a constant activation state, and a sub power component providing the internal source supply voltage in response to output signal of the sub differential amplifier.

30 Claims, 4 Drawing Sheets

SUPPLY VOLTAGE CONVERTER FOR HIGH-DENSITY SEMICONDUCTOR MEMORY DEVICE

BACKGROUND OF THE INVENTION

This invention relates in general to voltage converter circuits and more particularly to a supply voltage converter circuit for use in reduced geometry high-density semiconductor memory devices.

Recent semiconductor memory devices frequently have metal-oxide-semiconductor (MOS) transistors having an effective channel length short as 1 μm or even shorter, to achieve high-speed operation and increased integrity of circuit arrangement. Due to hot electrons, resulting from such a size reduction in MOS transistors, reliability of MOS transistors generally degrade. To prevent the reliability of MOS transistors from degrading due to channel punch-through, it is necessary to drive these devices with an internal source voltage of less than 5 volts, of which is in current use for a standard source voltage (or reference voltage) or an external source supply voltage. In general, MOS transistors of short channel length are used in memory array circuit of a dynamic random access memory (DRAM) devices comprising bit lines, sense amplifiers, bit-line precharging circuits and memory cells therein, and also in its peripheral devices. In DRAM devices, when the bit lines are precharged with the memory array circuit, a large instantaneous current flows into the memory array circuit. Hence, a variation of source voltage resulting from such a current affects operation of the peripheral and other circuits. To solve these problems, there has generally been employed a system having, on a same chip the source voltage converting circuit for memory array circuits and a source voltage converting circuit for peripheral circuits, independent of each other. However, an output buffer is driven with an external source voltage (usually 5 volts), to ensure its TTL (transistor-transistor-logic) level of output. Known art relating to such a source-supply-voltage converting circuit was disclosed in IEEE Journal of Solid State, June 1987 issue, VOL. SC-22, NO. 3, PP 437-440.

Referring to the known art of this treatise, the two source-supply-voltage converting circuits for a memory array circuit each and a peripheral circuit, each have the same construction as each other. Referring to FIG. 1 of the prior art, the source-supply-voltage converting circuit of the memory array contains a reference voltage generator 10, for generating a fixed reference voltage from an external supply voltage V1, a power MOS transistor Q1, for providing an internal supply voltage V2, equal to that is the reference voltage, to the memory array circuit, and a current-mirror differential amplifier 12 for comparing the reference voltage with the internal supply voltage and controlling conductance of the power MOS transistor Q1 so as to make the reference voltage identical to the internal supply voltage. The differential amplifier includes a load transistor Q3 activated by a pulse φ upon precharging of the bit lines, and another load transistor Q2 coupled with the load transistor Q3 in parallel and kept in a normally ON state. Since current flow through the power MOS transistor Q1 is subject to an abrupt change upon precharging the bit lines, a prompt response can be achieved by increasing the current flow through the differential amplifier 12.

Hence, the size (ratio of channel width as its length) of the load transistor Q3 is larger than that of the other load transistor Q2. Also, since the load transistor Q2 always keeps its conduction state (turn-ON state), its size should be made as small as possible in order to minimize its current consumption at a stand-by state. However, to improve gain of the differential amplifier 12, transistors Q4-Q7 within the differential amplifier are required to operate in their saturation regions. Therefore, since the transistors Q4-Q7 are designed to be large in size, taking into account the size of load transistor Q3 made turn-ON upon charging the bit lines consuming large current, the size of load transistor Q2 can not be freely made smaller irrespectively the size of transistors Q4-Q7. Hence, there may arise a problem that current consumption through the load transistor Q2 becomes large in its stand-by state. Furthermore, reducing the size of load transistor Q2 results in slow-down of operational speed in its stand-by state.

SUMMARY OF THE INVENTION

It is therefore an object of the invention to provide a source-supply-voltage converting circuit capable of reducing current consumption to as low as possible while achieving high-speed operation.

It is another object of the invention to provide a source-supply-voltage converting circuit capable of minimizing variation of an internal supply voltage, for use in a LSI semiconductor memory device.

To achieve the above objects and other advantages of the invention, the source-supply-voltage converting circuit for generating a lower internal supply voltage than an external supply voltage contains: a reference voltage generator for generating a constant reference voltage; peripheral power-supply circuit and array power-supply circuit for providing internal supply voltage to the peripheral circuits and array circuits, respectively; each of the peripheral and array power circuits containing: a divider, generating a voltage proportional to the internal supply voltage; a main power-supplying part, including a main differential amplifier, being activated by a given pulse, for comparing the proportional voltage with the reference voltage, and a main power component providing the internal source supply voltage in response to an output signal of the main differential amplifier; and a sub power supply part including a sub differential amplifier constant activation state, comparing the proportional voltage with the reference voltage, and a sub power component providing the internal source supply voltage in response to an output signal of the sub differential amplifier.

BRIEF DESCRIPTION OF THE DRAWING

For a better understanding of the invention and to show how the same may be carried into effect, reference will now be made, by way of example, to the accompanying diagrammatic drawings, in which.

DETAILED DESCRIPTION OF THE INVENTION

Figure 1:
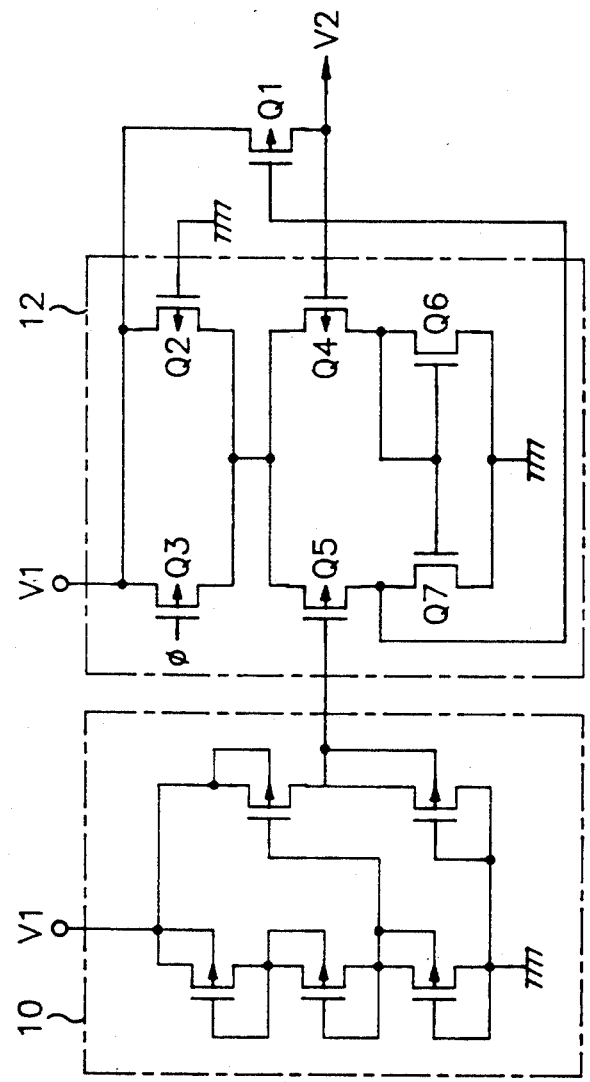
FIG. 1 is a circuit diagram of a known source supply voltage converting circuit.
Figure 2:
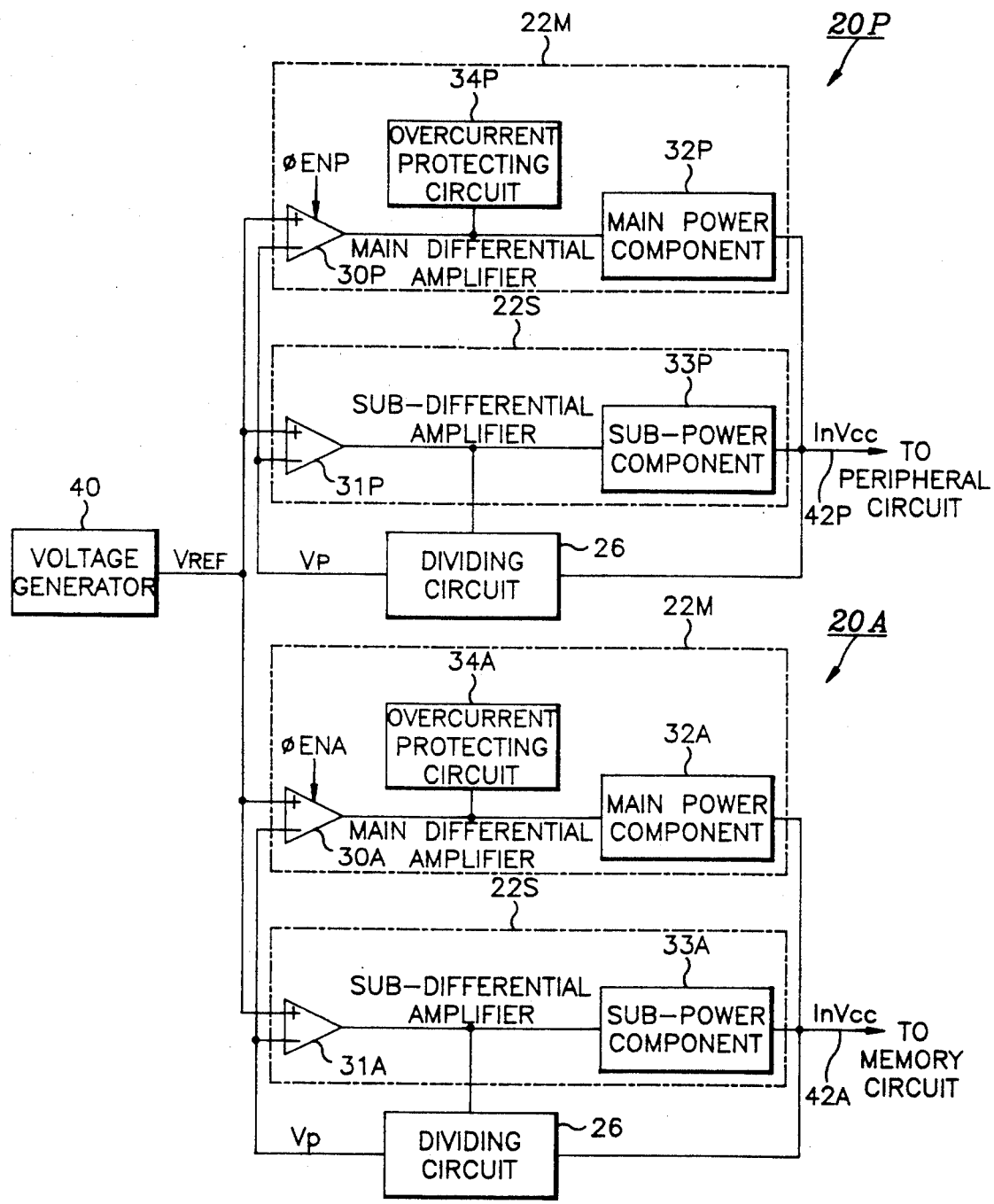
FIG. 2 is a block diagram of a circuit for converting a source supply voltage according to the present invention.

Referring to FIG. 2, the inventive source-supply-voltage converting circuit contains a peripheral power-supply circuit 20P for providing an internal supply voltage InVcc into peripheral circuits through a conductive output line 42P, an array power-supply circuit 20A for providing the internal supply voltage InVcc to memory array circuits through a conductor output line 42A, and a reference voltage generator 40 for providing a constant reference voltage VREF into the peripheral and array power-supply circuits 20P and 20A, respectively. The peripheral and array power-supply circuits each comprise a main power supply 22M, a sub power supply 22S and a dividing circuit 26 generating a voltage Vp proportional to the internal supply voltage InVcc.

The main power supply 22M includes a main differential amplifier 30P, activated by a peripheral ENABLE pulse $\phi$ENP, for comparing the reference voltage VREF of the reference voltage generator 40 with the proportional voltage Vp of the dividing circuit 26 and amplifying a voltage difference therebetween, a main power component 32P for providing a constant internal supply voltage InVcc lower than the external supply voltage Ex Vcc, in response to the output of the main differential amplifier, and an over-current protecting circuit 34P for preventing the main power component 32P from driving an excessively high current. In addition, the sub power supply 22S of the peripheral power-supply circuit 20P contains a sub differential amplifier 31P, being in a constant activation state, for comparing the reference voltage VREF of the reference voltage generator 40 with the proportional voltage Vp of the dividing circuit 26 and amplifying the voltage difference therebetween, and a sub power component 33P for providing the constant internal supply voltage InVcc lower than the external supply voltage, in response to the output of the sub differential amplifier 31P. In the meantime, the main power supply 22M and the sub power supply 22S forming a single array power-supply circuit 20A actually have the same configuration as those in the peripheral power-supply circuit 20P. However, the only difference in those two configurations is that the main differential amplifiers 30P and 30A are respectively activated by the peripheral ENABLE pulse $\phi$ENP and the array ENABLE pulse $\phi$ENA and the channel width of the main power component 32P is larger than that of the main power component 32A.

In DRAMs, the peripheral circuits consume large current (for a 4 mega-DRAM, about 50 mA) during a time period from enabling of the ROW Address Strobe $\overline{RAS}$ signal to equalization of, after completion of sensing, the bit lines, they generally consume up to ten times as much current as during a stand-by state except for the above mentioned time period. Thus the main differential amplifier 30P of the peripheral power-supply circuit 20P is activated by the peripheral enable pulse $\phi$EMP during the large current consumption period. However, since the sub differential amplifier 31P is always in an activation state, it supplies the internal supply voltage InVcc to its peripheral circuit. By using a main power supply 22M and a sub power supply 22S independently, a desirable effect will be rendered in reducing variation of the internal supply voltage upon large current consumption.

In the meantime, the array circuits have large current consumption (for a 4-mega DRAM, about 200 mA) to charge the bit lines from the time of enabling of the word lines to the completion of the sensing operation of the bit lines, after enabling the $\overline{RAS}$ signal. Hence, the main power supply 22M of the array power-supply circuit 20A is independently activated during the above period of large current consumption. The reason why the sub power supply 22S is utilized independently is the same as that for the peripheral power supply circuit 20P.

Figure 3:
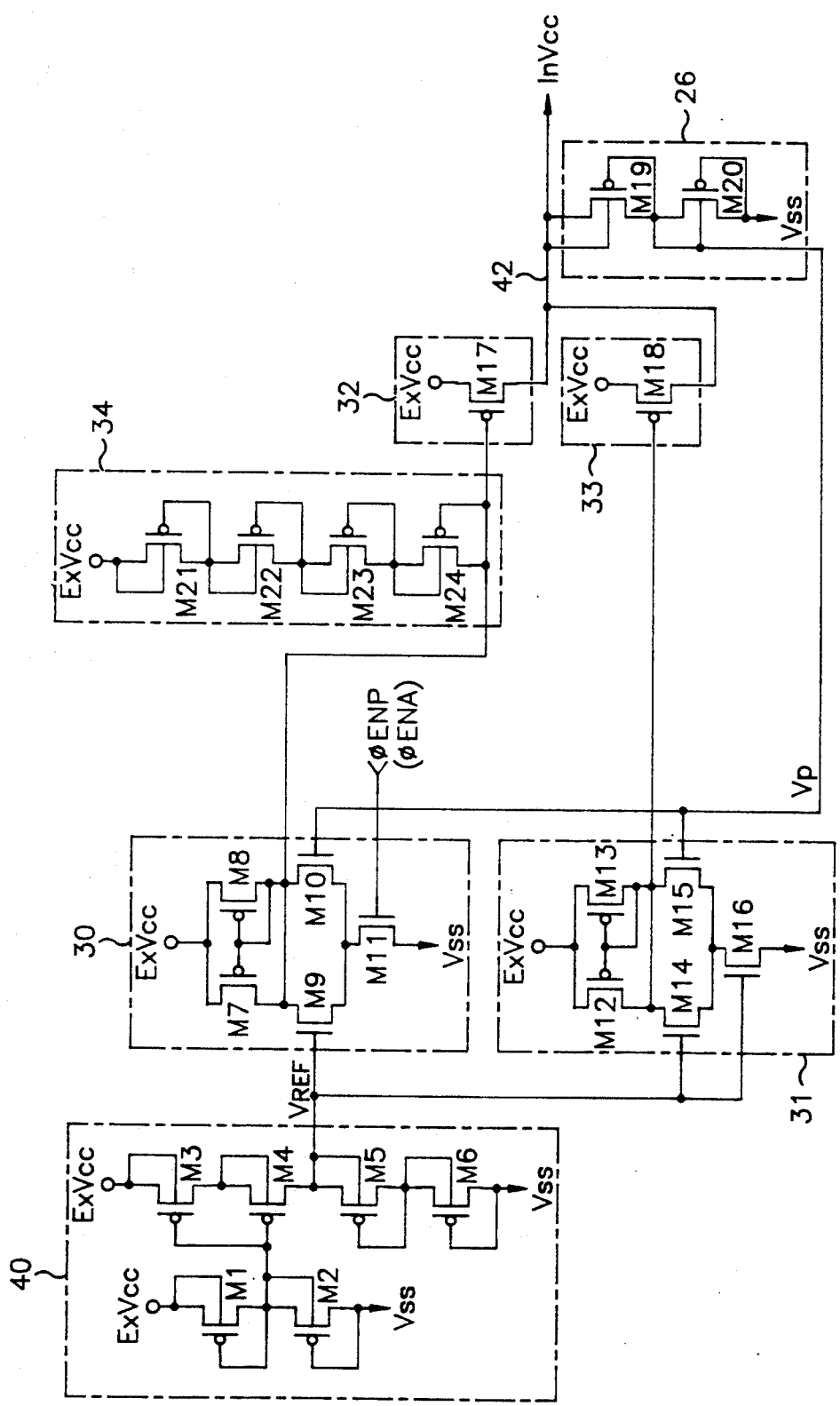
FIG. 3 is an electrical circuit diagram of a preferred embodiment of FIG. 2.

FIG. 3 shows an electrical circuit diagram according to a preferred embodiment of the peripheral power-supply circuit or the array power-supply circuit shown in FIG. 2, wherein the same elements or parts are shown in with the same reference numerals. ExVcc represents an external supply voltage (for example, 5 volts) applied through an external pin of a DRAM device, and Vss is a ground reference potential.

The reference voltage generator 40 comprised of P-channel MOSFETs M1-M6, which use a conventional configuration, generates a constant reference voltage VREF (about 1.6 volt). The dividing circuit 26 includes P-channel MOSFETs M19, M20 coupled in series between an output line 42 and the ground Vss. Transistors M19, M20 are each coupled in a diode-connection type, whose ON-resistance divides the internal supply voltage InVcc by its ratio thereby providing a voltage Vp proportional to the ratio. According to the embodiment of the present invention, when a normal internal supply voltage InVcc is 4 volts, the transistors M19, M20 would be designed so that the voltage Vp has the same value as the reference voltage VREF. These transistors M19, M20 may be replaced by corresponding resistors.

The main differential amplifier 30 includes and an active loader of a current mirror having P-channel MOSFETs M7 and M8, differential input transistors of N-channel MOSFETs, M9 and M10, wherein drains are each coupled to outputs of the current mirror, gates are coupled to the reference voltage VREF and the proportional voltage Vp respectively, and sources are coupled in common; and a pull-down transistor of N-channel MOSFET M11 wherein the gate is coupled to the pulse $\phi$ENP (or $\phi$ENA), a drain is coupled to a connection between the MOSFETs M9 and M10, and a source is coupled to the reference voltage Vss.

The sub differential amplifier 31 has a construction similar to that of the main differential amplifier 30. That is, the sub differential amplifier 31 includes an active loader of the current mirror having P-channel MOSFETs M12 and M13; differential input transistors of N-channel MOSFETs M14 and M15 each coupled to the reference voltage VREF and the proportional voltage Vp; and a pull-down transistor of N-channel MOSFET M16 whose gate is coupled to the reference voltage VREF and whose source is also coupled to the ground reference voltage Vss. Since the gate of the pull-down transistor M16 is coupled to the reference voltage, the sub differential amplifier 31 always operates. Hence, the main and sub differential amplifiers 30, 31 have the reference voltage VREF and the proportional voltage Vp as their difference inputs, and serve as single-ended-differential-amplifiers whose outputs are each provided from the drains of the transistors M9 and M14. The outputs of the main and sub differential amplifiers, respectively 30 and 31, are each coupled to a gate of P-channel MOSFET M17 of the main power component 32 and a gate of P-channel MOSFET M18 of the sub power component 33, of which drains are each coupled to the external supply voltage ExVcc and sources are each coupled to the output line 42. As described above, the transistor M17 supplying, into the peripheral circuits or the array circuits, large current according to the output signal of the main differential amplifier 30 activated by the pulse φENP (or φENA), is preferably designed with a channel width larger than that of the transistor M18 driven by the sub differential amplifier 31 at a constant activation state.

The over-current protecting circuit 34 includes a plurality of P-channel MOSFETs M21–M24 with diode connection, coupled between the external supply voltage ExVcc and the gate of the main power component 32, wherein owing to preventing the gate voltage of the main power component 32 from dropping below a given value (ExVcc-4 VTH), destruction of the main power component 32 resulting from its over-current will be prevented. Here, the voltage value VTH is an absolute value of threshold voltage of the transistors M21–M24.

Figure 4:
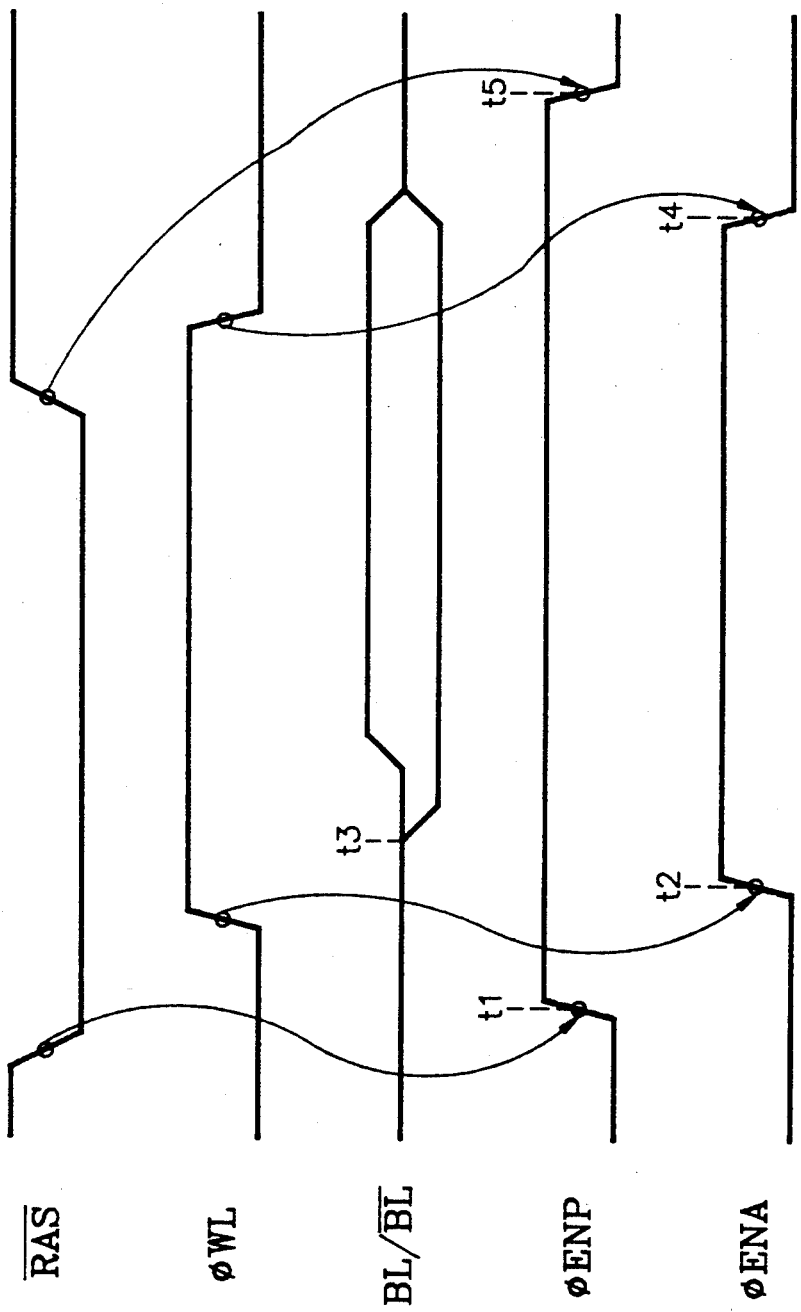
FIG. 4 is timing diagrams of ENABLE pulses, φENP and φENA, used in the invention.

FIG. 4 shows timing diagrams of the peripheral and array enable pulses, respectively φENP and φENA, in operation of the circuit of FIG. 3. Referring to the waveforms of the drawing, when $\overline{RAS}$ is enabled into logic low level, the peripheral enable pulse φENP changes its logic state from 'LOW' to 'HIGH' at a time t1. The logic high φENP activates the main differential amplifier 30P of the peripheral power-supply circuit. However, the array enable pulse φENA changes its logic state into high at a time t2 by the enabling of a pulse φWL activating the word line, thereby activating the main differential amplifier 30A of the array power-supply circuit 20A. Thereafter, from a time t3, a sensing operation of a bit line pair BL/$\overline{BL}$ is begun by the sense amplifier, and at a time t4, the sensing operation ends by disabling of the sense amplifier. The array enabling pulse φENA is disabled into logic low state at the time t4, thereby turning off the main differential amplifier 30A. In the meantime, since the peripheral circuit consume large current to equalize the bit lines even after completion of the sensing operation, the peripheral enable pulse φENP keeps its logic high state until completion (time t5) of the equalization of bit lines.

Referring to FIG. 3, the internal supply voltage InVcc is given by the equation (1):

$$InVcc = VREF \cdot (1 + R19/R20) \quad (1)$$

here, R19 and R20 are respective ON-resistances of the transistors M19 and M20.

Now, assuming that the differential amplifier 30 is activated by the pulse φENP or φENA, the operation of the circuit of FIG. 3 will be explained hereinafter. When the internal supply voltage InVcc goes below a fixed value, the proportional voltage Vp also goes below a reference voltage. Then, drain voltage potentials of the transistors M10 and M15 increase, whereas drain voltage potentials of the transistors M9 and M14 decrease in response thereto. By these decreases of drain potentials, the power components 32, 33 supply large current to the output line 42, thereby recovering the voltage potential of the output line 42 to-up the internal supply voltage InVcc given by the equation (1) mentioned above. The over-current protecting circuit 34 prevents the gate potential of the power component 32 from going down below a given value, thereby protecting the power component 32 from destruction.

As is apparent from the aforementioned description, the inventive source supply voltage converting circuit can achieve reduced current consumption because both main power-supply circuits of the peripheral and array power-supply circuits operate respectively in a time period requiring large current supply. In addition, since the respective sub power-supply circuits of the peripheral and array power-supply circuits operate independently from the main power-supply circuits, the variation of the internal supply voltage resulting from the large current supply may be minimized.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A circuit for converting a source-supply voltage, comprising:

means for generating a constant reference voltage; and first means for providing a first internal supply voltage to peripheral circuits and second means for providing a second internal supply voltage to array circuits, both of said first and second voltage providing means each comprising:

a dividing circuit, generating a first and second voltage proportional to the respective internal supply voltages;

a main power-supplying part comprising:

a main differential amplifier activated by a pulse, each making a comparison of the respective proportional voltages with said reference voltage and supplying an amplified output signal of the results of the respective comparisons; and a main power component providing said internal supply voltage in response to said first output signal from said main differential amplifier; and a sub power supply part comprising:

a sub differential amplifier in a constant state of activation, comparing said proportional voltage with said reference voltage and supplying a third amplified output signal of the result of the comparison; and a sub power component providing said internal supply voltage in response to said second output signal from said sub differential amplifier;

wherein said main differential amplifier in said first providing means comprises first terminal means to receive a first pulse, to activate said main differential amplifier in said first providing means, during a first period extending between enablement of a row address strobe signal and equalization of a plurality of bit lines; and said main differential amplifier in said second providing means comprises second terminal means to receive a second pulse, to activate said main differential amplifier in said second providing means during a second period extending between activation of a word line and completion of a sensing operation performed by a sense amplifier.

2. A circuit according to claim 1, wherein:

said main and sub differential amplifiers of said first and second voltage providing means are each single-ended differential amplifiers; and each of said power components of said first and second voltage providing means is comprised of a MOSFET having a gate coupled to an output of the corresponding differential amplifier of said power component, a drain coupled to an external source supply voltage, and a source providing said internal supply voltage.

3. A circuit according to claim 1, wherein said first and second means for providing are each further comprised of an over-current protection circuit coupled between the external voltage supply and a common connection between said main differential amplifier and main power component.

4. A circuit, comprising:
first generating means for generating a constant reference voltage;
conductive output line for transferring said internal supply voltage;
second generating means for generating a first voltage proportional to said internal supply voltage transferred by said output line;
first power supplying part activated by a given pulse, having a first differential amplifier for comparing said first voltage with said reference voltage and supplying a first output signal based on the output of the comparison and amplified in value and means for receiving said given pulse when a row address strobe occurs;
first power component providing said internal supply voltage in response to said first output signal from said first differential amplifier;
second power supplying part in a constant activation state, having a second differential amplifier for comparing said proportional voltage with said reference voltage and supplying a second output signal based on the output of the comparison and amplified in value; and
second power component providing said internal supply voltage in response to said second output signal of said second differential amplifier.

5. A circuit according to claim 1, wherein said first and second means for providing are each further comprised of an overcurrent protecting circuit having a plurality of MOSFET's serially coupled in a diode connection configuration and coupled between the external voltage supply and a common connection between said main differential amplifier and main power component.

6. A circuit as claimed in claim 5, wherein said main differential amplifier is comprised of plurality of MOSFET's forming an active load current mirror with a first differential input transistor stage having a drain coupled to provide said amplified output and a second differential input transistor stage having a drain coupled to a gate connection of said current mirror and a pull-down transistor having a gate coupled to receive said first pulse.

7. A circuit as claimed in claim 1, wherein said main differential amplifier is comprised of a plurality of MOSFET's forming an active load current mirror with a first differential input transistor stage having a drain coupled to provide said amplified output and a second differential input transistor stage having a drain coupled to a gate connection of the of said current mirror and a pull-down transistor having a gate coupled to receive said first pulse.

8. A circuit as claimed in claim 6, wherein said sub differential amplifier is comprised of MOSFET's forming an active load current mirror with a first differential input transistor stage having a drain coupled to provide said amplified output and a second differential input transistor stage having a drain coupled to a gate connection of the of said current mirror and a pull-down transistor having a gate coupled to said reference voltage.

9. A circuit as claimed in claim 1, wherein said sub differential amplifier is comprised of MOSFET's forming an active load current mirror with a first differential input transistor stage having a drain coupled to provide said amplified output and a second differential input transistor stage having a drain coupled to a gate connection of the of said current mirror and a pull-down transistor having a gate coupled to said reference voltage.

10. A circuit as claimed in claim 8, wherein said dividing circuits are comprised of a plurality of transistors serially connected in a diode-connection configuration between an output line and a reference potential.

11. A circuit as claimed in claim 1, wherein said dividing circuits are comprised of a plurality of transistors, serially connected in a diode-connection configuration between an output line and a reference potential.

12. A circuit as claimed in claim 8, wherein said dividing circuits are comprised of a plurality of resistors, connected in series between an output line and a reference potential.

13. A circuit as claimed in claim 1, wherein said dividing circuits are comprised of a plurality of resistors, connected in series between an output line and a reference potential.

14. A circuit as claimed in claim 2, wherein said second generating means is comprised of a plurality of transistors, serially connected in a diode-connection configuration between said output line and a reference potential and supplies a voltage proportional to the internal supply voltage to said first and second power supplying parts.

15. A circuit as claimed in claim 14, wherein, said second generating means comprises resistors connected in series between said output line and a reference potential and supplies a voltage proportional to the internal supply voltage to said first and second power supplying parts.

16. A circuit as claimed in claim 15, wherein said first power supplying part is comprised of a plurality of MOSFET's forming an active load current mirror with a first differential input transistor stage having a drain coupled to provide said amplified output and a second differential input transistor stage having a drain coupled to a gate connection of the of said current mirror and a pull-down transistor having a gate coupled to receive said first pulse.

17. A circuit as claimed in claim 16, wherein said second power supplying part is comprised of a plurality of MOSFET's forming an active load current mirror with a first differential input transistor stage having a drain coupled to provide said amplified output and a second differential input transistor stage having a drain coupled to a gate connection of said current mirror and a pull-down transistor having a gate coupled to said reference voltage.

18. A circuit as claimed in claim 17, further comprised of an over-current protecting circuit having of a plurality of MOSFET's coupled in a diode connection configuration and coupled between the external voltage supply and a common connection between said first power supplying part and first power component.

19. A circuit as claimed in claim 18, wherein said first power component comprises a MOSFET having a gate coupled to the output of said first power component, a drain coupled to an external source supply voltage and a source providing the internal supply voltage.

20. A circuit as claimed in claim 19, wherein said second power component comprises a MOSFET, having a gate coupled to the output of said second power component, a drain coupled to an external source supply voltage, and a source providing the internal supply voltage.

21. A circuit for converting a source-supply voltage, comprising:
   means for generating a constant reference voltage;
   means for providing an internal supply voltage to peripheral circuits;
   means for providing said internal supply voltage to array circuits;
   said means for supplying an internal supply voltage to peripheral circuits, further comprising;
      a first dividing circuit, generating a voltage proportional to said internal supply voltage;
      a first main power-supplying part comprising:
         a first main differential amplifier, activated by a first pulse, comparing said proportional voltage with said reference voltage; and
         a first main power component providing said internal source supply voltage in response to output signals from said first main differential amplifier; and
      a first sub power supply part comprising:
         a first sub differential amplifier, in a constant state of activation, comparing said proportional voltage with said reference voltage; and
         a first sub power component providing said internal source supply voltage in response to output signals from said first sub differential amplifier;
   said means for supplying an internal supply voltage to array circuits, further comprising;
      a second dividing circuit, generating a voltage proportional to said internal supply voltage;
      a second main power-supplying part comprising:
         a second main differential amplifier, activated by a second pulse, comparing said proportional voltage with said reference voltage; and
         a second main power component providing the internal source supply voltage in response to the output signals of said second main differential amplifier; and
      a second sub power supply part comprising:
         a second sub differential amplifier, in a constant state of activation, comparing said proportional voltage with said reference voltage; and
         a second sub power component providing said internal source supply voltage in response to output signals from said second sub differential amplifier.

22. A circuit according to claim 21, wherein said first pulse is enabled when enabling of a Row Address Strobe occurs and remains enabled until bit lines are equalized, and said second pulse is enabled when activation of a word line occurs and remains enabled until the completion of a sensing operation performed by a sense amplifier.

23. A circuit according to claim 21, further comprised of a first and second over-current protecting circuit both comprised of a plurality of MOSFET's serially coupled in diode connection configuration and coupled between the external voltage supply and a common connection between said first and second main differential amplifier and main power component respectively.

24. A circuit as claimed in claim 21, wherein both said first and second main differential amplifiers are comprised of a plurality of MOSFET's forming active loader current mirrors with differential input transistors having drains connected to the output of said current mirrors and pull-down transistors having a gate coupled to said first and second pulses, respectively.

25. A circuit as claimed in claim 23, wherein said first and second main differential amplifiers are comprised of a plurality of MOSFET's forming active loader current mirrors with differential input transistors having drains connected to the output of said current mirrors and pull-down transistors having a gate coupled to said first and second pulses, respectively.

26. A circuit as claimed in claim 21, wherein said first and second dividing circuits are each comprised of a plurality of transistors, serially connected in a diode connection configuration between an output line and a reference potential and supply a voltage proportional to the internal supply voltage to said first and second main and sub differential amplifiers, respectively.

27. A method for converting a source supply voltage comprising the steps of:
   generating a reference voltage;
   providing a first internal supply voltage to peripheral and array circuits;
   generating a first voltage proportional to said internal supply voltage;
   making first comparisons of said reference voltage to said first voltage;
   providing, by use of a sub power supply, said internal source supply voltage in response to the comparison of said reference and first voltages;
   making second comparisons of said reference voltage and first voltage upon receipt of an enable signal;
   providing, by use of a main power supply, said internal source supply voltage in response to the second comparisons from a second power supply component; and
   supplying current to peripheral and array circuits, the amplitude of the supplied current depending on the receipt of said enable signal.

28. A random access memory device comprising:
   bit lines for transporting data signals to a plurality of memory cells;
   sense amplifiers for amplifying the data signals transported in the bit lines; and
   a supply voltage converter for generating an internal supply voltage lower than an external supply voltage, comprising:
      first generating means for generating a constant reference voltage;
      conductive output line for transferring said internal supply voltage;
      second generating means for generating a first voltage proportional to said internal supply voltage transferred by said output line;
      first power supplying part, activated by a given pulse, having a first differential amplifier for comparing said first voltage with said reference voltage and supplying a first amplified output voltage based on the output of the comparison and amplified in value;

first power component providing said internal supply voltage in response to said first output signal from said first differential amplifier;

second power supplying part, in a constant activation state, having a second differential amplifier for comparing said first voltage with said reference voltage and supplying a second output signal based on the output of the comparison and amplified in value; and second power component providing said internal supply voltage in response to said second output signal of said second differential amplifier.

29. A circuit as claimed in claim 28, further comprised of an over-current protecting circuit having a plurality of MOSFET's coupled in a diode connection configuration and coupled between the external voltage supply and a common connection between said first power supplying part and first power component.

30. A circuit as claimed in claim 28 wherein said supply voltage converter includes:

said second generating means having a plurality of transistors connected in diode-connection type between an output line and a reference potential and supply a voltage proportional to the internal supply voltage to said first and second power supplying parts;

said first power supplying part having a plurality of MOSFET's forming an active loader current mirror with differential input transistors having drains connected to the output of said current mirror and a pull-down transistor having a gate coupled to said first pulse;

said second power supplying part having a plurality of MOSFET's forming an active loader current mirror with differential input transistors having drains connected to the output of said current mirror and a pull-down transistor having a gate coupled to said reference voltage;

said first power component having a MOSFET, with a gate coupled to the output of said first power component, a drain coupled to an external source supply voltage, and a source providing the internal supply voltage;

said second power component comprises a MOSFET, having a gate coupled to the output of said second power component, a drain coupled to an external source supply voltage, and a source providing the internal supply voltage.

* * * * *

UNITED STATES PATENT AND TRADEMARK OFFICE
CERTIFICATE OF CORRECTION

PATENT NO. : 5,144,585
DATED : September 1, 1992
INVENTOR(S) : Dong-Sun Min

It is certified that error appears in the above-indentified patent and that said Letters Patent is hereby corrected as shown below:

Column 1, Line 14   after "length" insert --as--;

Line 22   Before "which" delete "of";

Line 56   after "equal to" delete "that is";

Line 56   before "equal to" insert "that is the";

Column 3, Line 55   change "RAS" to --(RAS)--;

Column 4, Line 16   before "with" delete "in";

Column 5, Line 32   change "enable" to --enabling--:

Signed and Sealed this

Twenty-sixth Day of November 1996

Attest:

BRUCE LEHMAN

Attesting Officer   Commissioner of Patents and Trademarks